United States Patent [19]

Murphy

[11] Patent Number: 5,118,298
[45] Date of Patent: Jun. 2, 1992

[54] THROUGH HOLE MOUNTING OF INTEGRATED CIRCUIT ADAPTER LEADS

[75] Inventor: James V. Murphy, Warwick, R.I.

[73] Assignee: Advanced Interconnections Corporation, West Warwick, R.I.

[21] Appl. No.: 680,562

[22] Filed: Apr. 4, 1991

[51] Int. Cl.⁵ .............................................. H01R 9/09
[52] U.S. Cl. ........................................ 439/68; 29/827; 361/405
[58] Field of Search ................. 439/68, 69, 70, 71, 439/72, 73; 361/403–406, 408, 412; 357/69, 70; 29/827

[56] References Cited

U.S. PATENT DOCUMENTS

| | | | |
|---|---|---|---|
| 3,831,063 | 8/1974 | Keough | 361/408 |
| 3,899,231 | 8/1975 | Bray | 361/408 |
| 4,399,610 | 8/1983 | Moyer | 29/827 |
| 4,875,140 | 10/1989 | Delpech et al. | 361/412 |
| 5,012,386 | 4/1991 | McShane et al. | 361/406 |
| 5,036,431 | 7/1991 | Adachi et al. | 361/406 |
| 5,088,930 | 2/1992 | Murphy | 439/70 |

FOREIGN PATENT DOCUMENTS 61-182237  8/1986  Japan ................................ 439/74

Primary Examiner—Neil Abrams
Attorney, Agent, or Firm—Fish & Richardson

[57] ABSTRACT

An adapter that is to be conneced to contacts on a mother circuit surface. The adapter has a circuit bearing element, such as a printed circuit board, with connection sites that are connected to metalized holes opening onto its top side. Leads are anchored (e.g., by soldering) in the holes and bent down around the edge of the top side of the circuit bearing element to below it, and may be connected to the contacts on the mother circuit surface. The leads may be provided to the circuit bearing element, using lead frame elements provided in a lead frame, by bending the lead frame elements, soldering them in holes in the circuit bearing element, bending the soldered leads down around the edge of the top surface of the circuit bearing element and below it, and removing a side frame portion from the bent lead frame. Bending and cutting of the leads may be performed in a single operation with a single tool.

13 Claims, 3 Drawing Sheets

THROUGH HOLE MOUNTING OF INTEGRATED CIRCUIT ADAPTER LEADS

BACKGROUND OF THE INVENTION

The invention relates to methods of providing leads to adapters for interfacing to circuit elements such as circuit boards.

Integrated circuit packages have various types of leads. Quad flat pack packages (QFP) typically include four rows of gullwing-shaped leads with feet in a rectangular pattern. These packages are usually surface mounted on circuit boards or loaded into sockets. It is desirable to provide adapters that interface with a circuit board or socket designed to accept QFP packages. QFP adapters are described in my co-pending application entitled "Gullwing Circuit Adapter", Ser. No. 505,733, filed Apr. 6, 1990.

Such adapters include leads that interface with the circuit board, and other interconnect elements that may be connected to other circuitry such as a socket for an incompatible package type. In my above-mentioned application, the leads are soldered to the top surface of a circuit board element, as are terminals that interface with further portions of the adapter.

SUMMARY OF THE INVENTION

In general, the invention features an adapter that is to be connected to contacts on a mother circuit surface. The adapter has a circuit bearing element with connection sites that are connected to metalized holes opening onto its top side. Leads are anchored in the holes and bent down around the edge of the top side of the circuit bearing element to below it, and may be connected to the contacts on the mother circuit surface.

In general, the invention also features a method of providing gullwing-shaped leads to a circuit bearing element, in which lead frame elements are provided in a lead frame. The method includes bending the lead frame elements into a hook-shape, soldering them in holes in the circuit bearing element, bending the soldered leads down around the edge of the top surface of the circuit bearing element and below it, and removing a side frame portion from the bent lead frame.

In preferred embodiments, the leads are lead frame elements; the circuit bearing element is a printed circuit board; the leads are soldered to the holes in the circuit bearing element; the leads are bent outwardly below the circuit bearing element to form feet for attachment to the circuit surface; the leads are bent in a gullwing shape with two opposing curves; receptacles are connected to the connection sites and a chimney provides a mounting for the receptacles; a through-hole pin reinforces the mechanical connection between the adapter and the circuit surface; the contacts are arranged in a pattern having four rows of contacts; one row on each side of a rectangular pattern; the corners of the soldered lead frame are removed before the step of bending the soldered leads; the step of removing a side portion from the bent lead frame is performed after the step of bending the soldered leads; the bending operations are performed with bending tools; the steps of bending the soldered leads and cutting the leads are performed in a single operation with a single tool.

The method of providing leads of the invention has the advantage of yielding leads that are solidly anchored in plated holes in a circuit bearing element such as a circuit board. A single operation is sufficient to install all of the leads at once, and another single operation bends and cuts all of the leads. Because the leads are bent from the top of the circuit bearing element, the leads are useable with sockets that make contact with the inner surface of the leads, such as those shown in my co-pending application entitled "Integrated Circuit Socket with Reed-Shaped Leads", Ser. No. 616,180, filed Nov. 20, 1990.

DESCRIPTION OF THE PREFERRED EMBODIMENT

Figure 1:
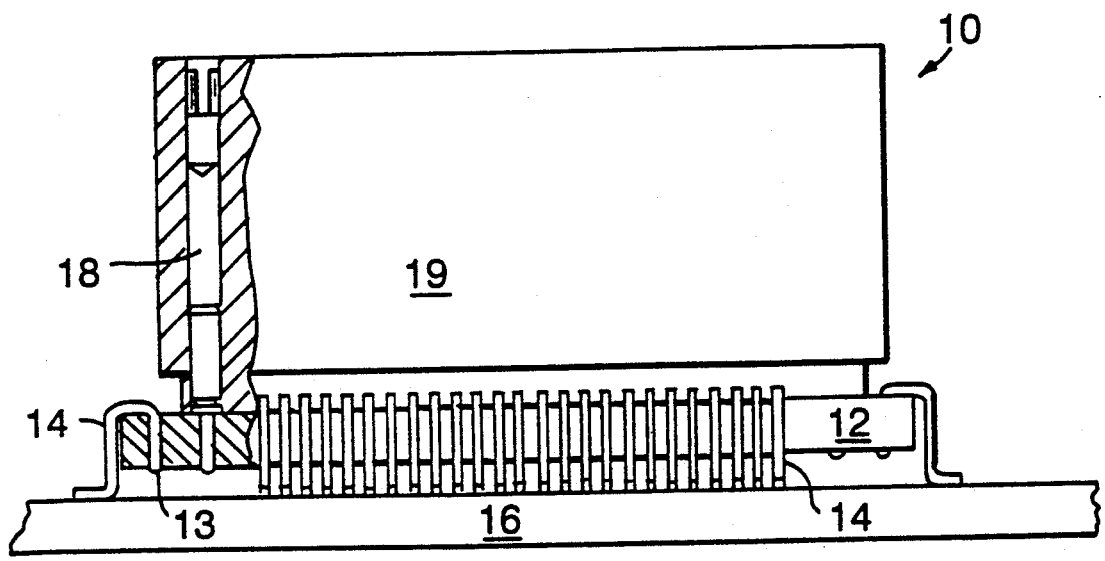
FIG. 1 shows a partially sectioned elevation of the adapter of the invention.

Referring to FIG. 1, a QFP adapter 10 includes a circuit bearing element, such as a printed circuit board element 12, with plated, or otherwise metalized, holes 13 that accept bent gullwing-shaped leads 14. These leads are soldered to the circuit board element at one end and include feet at the other end which may be soldered to pads arranged in four rows on a mother circuit board 16 or mounted in a suitable socket (not shown). Other interconnect elements, such as receptacles 18 embedded in chimney 19 are also connected to the circuit board element 12 and allow for connection to external circuitry.

Figure 2:
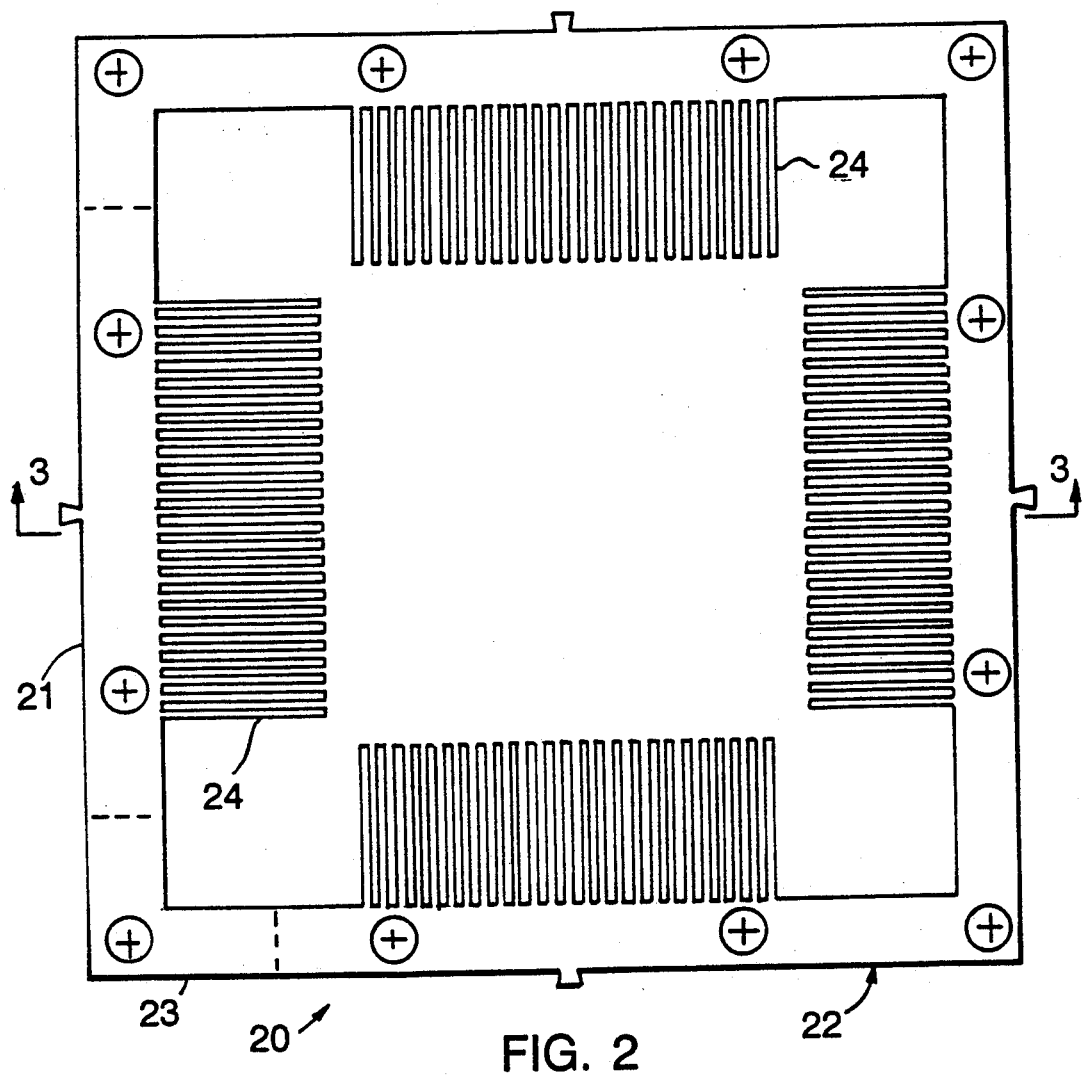
FIG. 2 is a top plan view of a lead frame prior to assembly in the adapter of FIG. 1.
Figure 3:
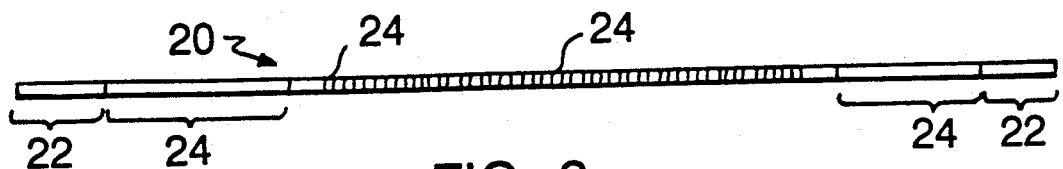
FIG. 3 is a cross-section of the lead frame of FIG. 2 along 3—3, before the bending operations.

Referring to FIGS. 2 and 3, a lead frame 20 for use in assembling an adapter according to the invention includes a frame portion 22 and lead elements 24. The lead frame may be made by stamping or etching or by any other suitable method.

Figure 4:
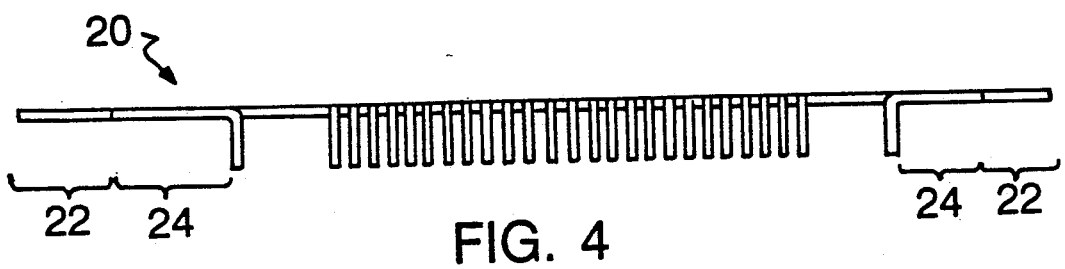
FIG. 4 presents the view of FIG. 3 after the first bending operation.
Figure 5:
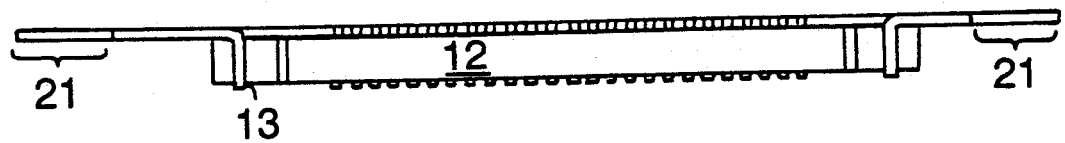
FIG. 5 presents the view of FIG. 3 after the lead frame has been soldered to its printed circuit board element and its corners have been removed.
Figure 6:
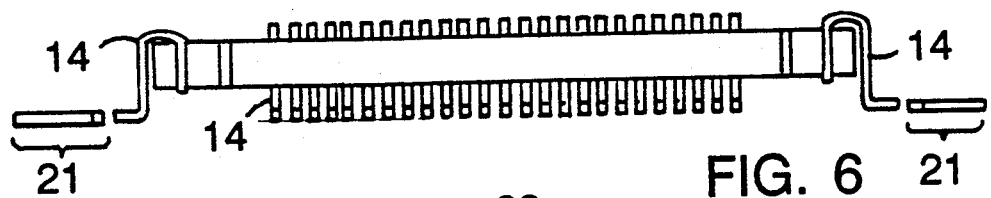
FIG. 6 presents the view of FIG. 3 after the second bending operation, and shows the removal of the frame portions of the lead frame.

In assembling an adapter, the lead elements 24 of the lead frame are first bent (FIG. 4) to a hook-shape in a bending apparatus. Once bent, the lead frame ends are inserted in corresponding holes in the printed circuit board 12, and the lead elements are anchored in place, for example, by infra-red soldering (FIG. 5). With the lead frame soldered in place, its corners 23 (FIG. 2) are cut away. The leads are then bent to their final gullwing shape (FIG. 6) in a second bending operation and the remaining side frame portions 21 (FIG. 2) are cut away.

It is observed that it is important to be careful to prevent solder from flowing substantially away from the solder holes along the lead frame during soldering, as this solder may interfere with the second bending operation.

Figure 7:
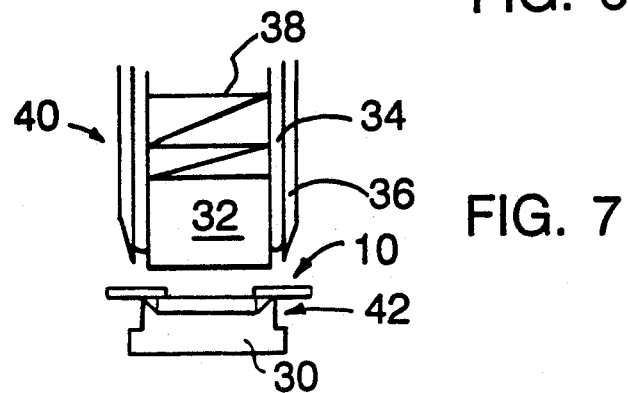
FIG. 7 shows a schematic cross section of a bending apparatus for use in the second bending and cutting operations.

The second bending operation and the cutting operation may be performed in a single operation using a bending apparatus. Referring to FIG. 7, the soldered but unfinished adapter 10 is placed on a pedestal 30, and the bending tool 40 is lowered onto the part. Upon lowering the tool, a spring-loaded jaw 32 first engages the adapter and holds it in place on its pedestal. As the tool continues to descend, four bending implements 36 engage the leads and bend them around bending dice 42 on the pedestal. These dice are designed to guide the leads down around the edges of the top of the printed circuit element and impart them with the opposing curves and feet of a gullwing shape. They are also dimensioned to allow for a certain amount of overbending, so that the leads spring into their specified shape when the implements are retracted. Finally, as the tool reaches the end of its stroke, four blades 36 cut away the remaining side portions 21 (FIG. 2) of the frame portion of the lead frame.

The above manufacturing process has the advantage of performing several steps in a single operation with a single tool. It is, of course, possible to separate the cutting and bending operations into separate individual operations.

The unfinished adapter is now ready for further operations, such as the addition of a chimney 19 and embedded receptacles as shown in FIG. 1. These receptacles may be electrically connected to attachment sites on the printed circuit element. These sites are connected to the leads by circuit elements, such as copper traces within the printed circuit element, thus providing connections between the receptacles and the leads. Through-hole-type pins may also be provided on the adapter, for the purpose of reinforcing the mechanical connection between the adapter and the mother circuit board, when soldered in place.

Other embodiments are within the following claims.

I claim:

1. An adapter for connecting to contacts an integrated circuit package to contacts on a mother circuit surface, comprising:
    a circuit bearing element having a top surface with a plurality of edges, a plurality of metalized holes opening onto said top surface, and a plurality of connection sites electrically connected to said holes, and
    a plurality of leads, cut from the same lead frame, anchored in said holes and bent down around said edges of said top surface of said circuit bearing element to below said circuit bearing element and also bent outwardly to form a gullwing shape having two opposing curves and feet for connection to the contacts on the mother circuit surface, said anchored and bent leads providing primary support for said circuit bearing element and being exposed on said top surface of said circuit bearing element.

2. The adapter of claim 1 wherein said circuit bearing element is a printed circuit board.

3. The adapter of claim 1 wherein said leads are soldered to said holes in said circuit bearing element.

4. The adapter of claim 1 further including receptacles connected to said connection sites and a chimney providing a mounting for said receptacles.

5. The adapter of claim 1 wherein said contacts are arranged in a pattern having four rows of contacts, one row on each side of a rectangular pattern.

6. An adapter for connecting an integrated circuit package to a mother circuit surface on which there are contacts arranged in a pattern having four rows of contacts, one row on each side of a rectangular pattern, said adapter comprising:
    a printed circuit board element having a top surface with a plurality of edges, a plurality of plated holes opening onto said top surface, and a plurality of connection sites electrically connected to said holes, and
    a plurality of leads, cut from the same lead frame, soldered in said holes and bent down around said edges of said top surface of said printed circuit board element to below said printed circuit board element and also bent outwardly to form a gullwing shape having two opposing curves and feet for attachment to the contacts on said mother circuit surface, said soldered and bent leads providing primary support for said printed circuit board element and being exposed on said top surface of said printed circuit board element.

7. The adapter of claim 6 further including receptacles connected to said connection sites and a chimney embedding said receptacles.

8. A method of providing gullwing-shaped leads to an adapter for connecting an integrated circuit package to contacts on a mother circuit surface, said method including the steps of
    providing a circuit bearing element having a top surface with a plurality of edges, a plurality of metalized holes opening onto said top surface, and a plurality of connection sites electrically connected to said holes,
    providing a plurality of lead frame elements in a lead frame,
    bending said lead frame elements into a hook-shape,
    soldering said bent lead frame elements in said holes in the circuit bearing element,
    bending the soldered leads down around said edges of the top surface of the circuit bearing element and below the circuit bearing element,
    bending the soldered leads outwardly to form a gullwing shape having two opposing curves and feet for connection to the contacts on the mother circuit surface, said soldered and bent leads providing primary support for said circuit bearing element and being exposed on said top surface of said circuit bearing element, and
    removing a side frame portion from said bent lead frame.

9. The method of claim 8, wherein said step of removing a side portion from said bent lead frame is performed after said step of bending said soldered leads.

10. The method of claim 8 wherein said bending operations are performed with bending tools.

11. The method of claim 8 wherein said steps of bending said soldered leads and cutting said leads are performed in a single operation with a single tool.

12. The method of claim 8 wherein said lead frame has four corners.

13. The method of claim 12, further including the steps of removing the corners of said soldered lead frame before said step of bending said soldered leads.

* * * * *

UNITED STATES PATENT AND TRADEMARK OFFICE
CERTIFICATE OF CORRECTION

PATENT NO. : 5,118,298
DATED : June 2, 1992
INVENTOR(S) : James V. Murphy

It is certified that error appears in the above-indentified patent and that said Letters Patent is hereby corrected as shown below:

Column 3, line 35, after "connecting" delete "to contacts".

Signed and Sealed this

Seventeenth Day of August, 1993

Attest:

BRUCE LEHMAN

*Attesting Officer*     *Commissioner of Patents and Trademarks*